(12) United States Patent
Tang et al.

(10) Patent No.: US 12,292,689 B2
(45) Date of Patent: May 6, 2025

(54) ALKALINE CLEANING COMPOSITION, CLEANING METHOD, AND MANUFACTURING METHOD OF SEMICONDUCTOR

(71) Applicant: Daxin materials corporation, Taichung (TW)

(72) Inventors: Hui-yi Tang, Taichung (TW); Tzu-chi Wang, Taichung (TW); Yu-nung Chen, Taichung (TW); Yi-cheng Chen, Taichung (TW)

(73) Assignee: Daxin materials corporation, Taichung (TW)

( * ) Notice: Subject to any disclaimer, the term of this patent is extended or adjusted under 35 U.S.C. 154(b) by 751 days.

(21) Appl. No.: 17/561,603

(22) Filed: Dec. 23, 2021

(65) Prior Publication Data

US 2022/0206394 A1  Jun. 30, 2022

(30) Foreign Application Priority Data

Dec. 24, 2020 (TW) ................................ 109146082

(51) Int. Cl.

| | | |
|---|---|---|
| *C11D 3/30* | (2006.01) | |
| *C11D 3/20* | (2006.01) | |
| *C11D 3/28* | (2006.01) | |
| *C11D 3/43* | (2006.01) | |
| *C11D 3/44* | (2006.01) | |
| *C11D 7/32* | (2006.01) | |
| *C11D 7/50* | (2006.01) | |
| *G03F 7/32* | (2006.01) | |

(52) U.S. Cl.
CPC ............ *G03F 7/322* (2013.01); *C11D 3/2068* (2013.01); *C11D 3/28* (2013.01); *C11D 3/30* (2013.01); *C11D 3/43* (2013.01); *C11D 7/3209* (2013.01); *C11D 7/3218* (2013.01); *C11D 7/3281* (2013.01); *C11D 7/50* (2013.01); *C11D 2111/22* (2024.01)

(58) Field of Classification Search
CPC ........... C11D 3/28; C11D 3/30; C11D 3/2068; C11D 3/43; C11D 7/3281; C11D 7/3218; C11D 7/3209; C11D 7/50
USPC ....... 510/175, 176, 493, 499, 500, 504, 505, 510/506
See application file for complete search history.

(56) References Cited

U.S. PATENT DOCUMENTS

| | | | |
|---|---|---|---|
| 7,700,533 B2 | 4/2010 | Egbe et al. | |
| 7,888,301 B2 | 2/2011 | Bernhard et al. | |
| 8,440,599 B2 | 5/2013 | Egbe et al. | |
| 8,617,417 B2 | 12/2013 | Inaba et al. | |
| 9,217,929 B2 | 12/2015 | Egbe et al. | |
| 9,570,285 B2 | 2/2017 | Liu et al. | |
| 10,035,978 B2 | 7/2018 | Oie et al. | |
| 2007/0225188 A1 | 9/2007 | Wang | |
| 2008/0096785 A1 | 4/2008 | Egbe et al. | |
| 2010/0152086 A1* | 6/2010 | Wu ........................... | C11D 3/43 510/175 |
| 2015/0133356 A1* | 5/2015 | Pollard .................. | C11D 3/044 510/175 |

FOREIGN PATENT DOCUMENTS

| | | | |
|---|---|---|---|
| CN | 101794088 A | 8/2010 | |
| CN | 102051283 A | 5/2011 | |
| EP | 1612858 A2 | 1/2006 | |
| EP | 2281867 A1 * | 2/2011 | ......... C11D 11/0047 |
| EP | 3553811 A1 * | 10/2019 | ......... C11D 11/0047 |
| JP | H09269601 A | 10/1997 | |
| JP | 2008103730 A | 5/2008 | |
| JP | 2008129571 A | 6/2008 | |
| JP | 2009224782 A | 10/2009 | |
| JP | 2018109154 A | 7/2018 | |
| TW | 200700938 A | 1/2007 | |
| TW | 201139659 A | 11/2011 | |
| TW | 201638679 A | 11/2016 | |
| WO | 2015166826 A1 | 11/2015 | |
| WO | 2017150620 A1 | 9/2017 | |
| WO | 2020235605 A1 | 11/2020 | |

OTHER PUBLICATIONS

European Search Report in European application No. 21216531.0, mailed on Aug. 26, 2022.
Japanese Office Action issued in corresponding Japanese Patent Application No. 2021206025.A dated Feb. 14, 2023, pp. 1-3.

* cited by examiner

*Primary Examiner* — Gregory R Delcotto
(74) *Attorney, Agent, or Firm* — PV IP PC; Wei Te Chung

(57) ABSTRACT

An alkaline cleaning composition is provided. The alkaline cleaning composition includes an alkaline compound, 5% to 40% by weight of propylene glycol monomethyl ether, 10% to 30% by weight of water, and a polar solvent. Wherein, the polar solvent includes acetals, glycol ethers, pyrrolidones, or a combination thereof, and the alkaline cleaning composition is free of benzenesulfonic acid.

9 Claims, No Drawings

ALKALINE CLEANING COMPOSITION, CLEANING METHOD, AND MANUFACTURING METHOD OF SEMICONDUCTOR

CROSS REFERENCE TO RELATED APPLICATIONS

The present application claims priority of the Taiwan Patent Application No. 109146082, filed on Dec. 24, 2020 with the Taiwan Intellectual Property Office, titled "Alkaline cleaning composition, cleaning method, and manufacturing method of semiconductor", which is incorporated by reference in the present application in its entirety.

FIELD OF INVENTION

The present disclosure relates to a cleaning composition for a semiconductor manufacturing process, and more particularly, to an alkaline cleaning composition, a cleaning method using the alkaline cleaning composition, and a manufacturing method of a semiconductor.

BACKGROUND OF INVENTION

Semiconductor devices are usually formed by stacking functional layers such as metal wiring layers, dielectric layers, insulating layers, and anti-reflective layers on semiconductor substrates which are composed of silicon wafers. Resist patterns formed by photolithography processes are used as masks for etching, and above-mentioned layers are processed to form above-mentioned laminated layers. The resist patterns in the photolithography processes mentioned above are formed by using film layers such as resist films, anti-reflective films, or sacrificial films.

Residues generated from the metal wiring layers or the dielectric layers in etching steps are removed by cleaning liquid, thereby preventing subsequent processes from being adversely affected, and reducing problems of yields of the semiconductor devices caused by the residues. In general, coating films that can be removed by the cleaning liquid are, for example, the resist films corresponding to various exposure wavelengths such as g-line, i-line, KrF excimer laser, ArF excimer laser, EUV, etc., the anti-reflective films disposed under the resist films, the sacrificial films composed of inorganic films such as silicon masks that contain silicon atoms, or protective films disposed on the resist films. Specifically, in liquid immersion lithography, resist underlayers, the resist films, and the protective films are stacked on substrates in sequence, so developing a cleaning liquid that can be used to clean and effectively remove various film layers that are used as masks without affecting yields of the subsequent processes has always been a direction of continuous efforts for industries.

SUMMARY OF INVENTION

An objective of the present disclosure is to provide an alkaline cleaning composition to effectively clean and remove residues of resists, inorganic films containing silicon, or other film layers on substrates or semiconductor substrates. The alkaline cleaning composition for semiconductor manufacturing pollutant emissions can be reduced to realize requirements of environmental protection and can effectively prevent yields of subsequent processes from being affected.

In an embodiment of the present disclosure, the alkaline cleaning composition includes an alkaline compound, 5% to 40% by weight of propylene glycol monomethyl ether, 10% to 30% by weight of water, and a polar solvent. Wherein, the polar solvent includes acetals, glycol ethers, pyrrolidones, or a combination thereof, and the alkaline cleaning composition is free of benzenesulfonic acid.

Another objective of the present disclosure is to provide a cleaning method. The cleaning method includes a step of using the alkaline cleaning composition mentioned above to clean and remove a residue or a residual film attached onto a device component, wherein, the residue or the residual film includes a resist or an inorganic substance containing silicon atoms.

Yet another objective of the present disclosure is to provide a manufacturing method of a semiconductor. The manufacturing method of the semiconductor includes following steps:

providing a substrate;

coating a siloxane resin layer on the substrate;

coating a photoresist layer on the siloxane resin layer to form a multilayered substrate;

performing photolithography and etching processes on the multilayered substrate; and using the alkaline cleaning composition mentioned above to clean and remove residues of the siloxane resin layer and the photoresist layer attached onto the substrate.

DETAILED DESCRIPTION OF PREFERRED EMBODIMENTS

Before describing at least one embodiment of the present disclosure in detail, it should be understood that the present disclosure is not necessarily limited to its application in the details illustrated in the following examples, for example, the number of embodiments, specific mixing ratio used thereof, etc. The present disclosure can be implemented or realized in other embodiments or in various ways.

[Alkaline Cleaning Composition]

The present disclosure provides an alkaline cleaning composition that can effectively clean and remove residues of resists, inorganic films containing silicon, or other film layers on substrates or semiconductor substrates. The alkaline cleaning composition includes an alkaline compound, 5% to 40% by weight of propylene glycol monomethyl ether, 10% to 30% by weight of water, and a polar solvent. Wherein, the polar solvent includes acetals, glycol ethers, pyrrolidones, or a combination thereof to be a second solvent, and the alkaline cleaning composition is free of benzenesulfonic acid. This combination of the alkaline cleaning composition can effectively remove the residues of the resists and film layers remaining on the substrates and has a lower content of volatile organic compounds (VOCs), thereby realizing requirements of environmental protection. Each component will be described in detail in the following.

[Alkaline Compound]

In an embodiment of the present disclosure, the alkaline compound may include quaternary ammonium hydroxide, an alkanolamine compound, or a mixture thereof.

In an embodiment of the present disclosure, the quaternary ammonium hydroxide has a structure shown in a following formula (1):

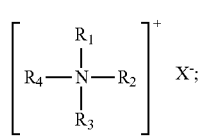

formula (1)

wherein, $R_1$ to $R_4$ are each independently a $C_1$-$C_4$ linear or branched alkyl group that is unsubstituted or substituted with a hydroxyl group, and X is OH.

Specifically, in an embodiment of the present disclosure, the quaternary ammonium hydroxide may include at least one of tetramethylammonium hydroxide (TMAH), tetraethylammonium hydroxide, tetrapropylammonium hydroxide, tetrabutylammonium hydroxide, ethyltrimethylammonium hydroxide, diethyldimethylammonium hydroxide, (2-hydroxyethyl)trimethylammonium hydroxide, bis(2-hydroxyethyl)dimethylammonium hydroxide, or tris(2-hydroxyethyl)methylammonium hydroxide. In an embodiment of the present disclosure, the quaternary ammonium hydroxide is preferably tetramethylammonium hydroxide.

In an embodiment of the present disclosure, the alkanolamine compound has a structure shown in a following formula (2):

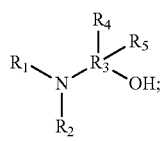

formula (2)

wherein, $R_1$ and $R_2$ are independently hydrogen or a $C_1$-$C_6$ linear or branched alkyl group that is unsubstituted or substituted with a hydroxyl group; $R_3$ is a $C_1$-$C_8$ alkylene group that is unsubstituted or at least one —$CH_2$— is substituted with —O— or —NH—, wherein, when two or more than two —$CH_2$— are substituted, —O— is not directly bonded to —O— or —NH—, and —NH— is not directly bonded to —NH—; $R_4$ and $R_5$ are each independently hydrogen or a $C_1$-$C_3$ alkyl group that is unsubstituted or substituted with a hydroxyl group.

Specifically, in an embodiment of the present disclosure, the alkanolamine compound may include at least one of ethanolamine (MEA), diethanolamine, triethanolamine, propanolamine (N-PA), bis(3-hydroxypropyl)amine, tris(3-hydroxypropyl)amine, diisopropanolamine, triisopropanolamine, N-methylethanolamine, 2-amino-2-methyl-1,3-propanediol, or 2-(2-aminoethoxy)ethanol. In an embodiment of the present disclosure, the alkanolamine compound is preferably propanolamine, ethanolamine, or 2-amino-2-methyl-1,3-propanediol.

In an embodiment of the present disclosure, the alkaline compound may be a mixture of the quaternary ammonium hydroxide mentioned above and the alkanolamine compound mentioned above.

Specifically, an amount of the alkaline compound in a total amount of the alkaline cleaning composition ranges from 0.1% to 20% by weight, and preferably 0.5% to 10% by weight. In this range, the alkaline compound can effectively remove the residues of the resists, the inorganic films containing silicon, or other film layers.

[First Solvent]

In an embodiment of the present disclosure, the first solvent includes 5% to 40% by weight of propylene glycol monomethyl ether (PGME). Preferably, propylene glycol monomethyl ether ranges from 15% to 30% by weight. It should be noted that the above-mentioned weight percentages are based on the total amount of the alkaline cleaning composition.

Specifically, by including propylene glycol monomethyl ether in the aforementioned weight ranges as the first solvent, the alkaline cleaning composition of the present disclosure has an excellent cleaning ability to the residues of the resists, the inorganic films containing silicon, or other film layers.

[Water]

In an embodiment of the present disclosure, the alkaline cleaning composition of the present disclosure includes 10% to 30% by weight of water. Preferably, a weight percentage of water ranges from 15% to 25% by weight. It should be noted that the above-mentioned weight percentages are based on the total amount of the alkaline cleaning composition.

Specifically, pure water, deionized water, or ion exchange water may be used as water of the present disclosure, which is not specifically limited herein, as long as the weight percentage of water is within the above-mentioned weight ranges.

[Polar Solvent as a Second Solvent]

In an embodiment of the present disclosure, the alkaline cleaning composition of the present disclosure also includes the polar solvent as the second solvent. The polar solvent includes acetals, glycol ethers, pyrrolidones, or a combination thereof.

In an embodiment of the present disclosure, the acetals include a structure shown in a following formula (3):

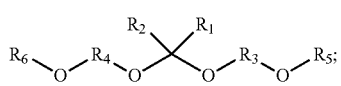

formula (3)

wherein, $R_1$ and $R_2$ are independently hydrogen or a $C_1$-$C_6$ linear or branched alkyl group that is unsubstituted or at least one —$CH_2$— is substituted with —O—; $R_3$ and $R_4$ are independently a $C_1$-$C_4$alkylene group; and $R_5$ and $R_6$ are independently a $C_1$-$C_3$ alkyl group.

In an embodiment of the present disclosure, the glycol ethers include a structure shown in a following formula (4):

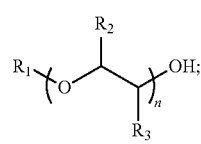

formula (4)

wherein, $R_1$ is hydrogen or a $C_1$-$C_4$ linear or branched alkyl group that is unsubstituted or substituted with a hydroxyl group; $R_2$ and $R_3$ are independently hydrogen or a $C_1$-$C_2$ alkyl group; and n is an integer ranging from 1 to 4.

In an embodiment of the present disclosure, the pyrrolidones include a structure shown in a following formula (5):

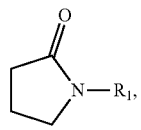

formula (5)

wherein, $R_1$ is a $C_1$-$C_3$ alkyl group.

Specifically, in an embodiment of the present disclosure, the polar solvent is preferably at least one: 4,8-dimethyl-2,5,7,10-tetraoxaundecane, 2,5,7,10-tetraoxaundecane (TOU), 6-(2-methoxyethoxy)-2,5,7,10-tetraoxaundecane, propylene glycol (PG), propylene glycol monoethyl ether, ethylene glycol monomethyl ether, ethylene glycol monobutyl ether, diethylene glycol monomethyl ether, diethylene glycol monoethyl ether (EDG), diethylene glycol monobutyl ether, dipropylene glycol monomethyl ether (DPGME), N-methyl-2-pyrrolidone, N-ethyl-2-pyrrolidone, and N-isopropyl-2-pyrrolidone (NIP). Among the above, the polar solvent may include one, two, or more than two.

More preferably, the polar solvent is at least one: N-isopropyl-2-pyrrolidone, N-ethyl-2-pyrrolidone, 2,5,7,10-tetraoxaundecane, diethylene glycol monoethyl ether, diethylene glycol monobutyl ether, and propylene glycol.

Specifically, the polar solvent accounts for 5% to 84.9% by weight of the total amount of the alkaline cleaning composition, and preferably 20% to 70% by weight. By defining the polar solvent within this range, the alkaline cleaning composition can effectively remove the residues of the resists, the inorganic films containing silicon, or other film layers.

[Other Additives]

The alkaline cleaning composition of the present disclosure may also include other additives, such as a surfactant and a metal corrosion inhibitor.

Specifically, the metal corrosion inhibitor has no other special restrictions except that the metal corrosion inhibitor is free of benzenesulfonic acids. The metal corrosion inhibitor may be, for example, benzimidazole, benzotriazole, methyl benzotriazole, 3-amino-1,2,4-triazole, 1,2,4-triazole, 1,2,3-triazole, 5-aminotetrazole, 2,6-pyridinedicarboxylic acid, phenylurea, p-methoxyphenol, pyrocatechol, resorcinol, 2-hydroxypyridine, 2-aminophenol, 8-hydroxyquinoline, phosphoric acid, boric acid, phthalic acid, ascorbic acid, adipic acid, malic acid, oxalic acid, or salicylic acid.

The surfactant may be an anionic surfactant, a cationic surfactant, or a non-ionic surfactant, and is not specifically limited herein. The surfactant may be, for example, polyoxyethylene alkyl ether, ethylene oxide/propylene oxide copolymer, polyoxyethylene alkyl aryl ether, acetylenic alcohol-based surfactants, etc.; specifically, such as octylphenol polyethylene glycol ether, ethoxylated tetramethyldecynediol, etc.

[Cleaning Method]

The cleaning method of the present disclosure includes a step of using the alkaline cleaning composition of the present disclosure to clean and remove a residue or a residual film attached onto any device component. The cleaning method of the present disclosure includes various cleaning methods, such as immersion cleaning, spray cleaning, or other cleaning methods. The residue or the residual film mentioned above includes the resists or inorganic substances containing silicon atoms. The device component mentioned above is not specifically limited, as long as it is necessary to use film layers such as resist films, anti-reflective films, sacrificial films composed of inorganic films such as silicon masks that contain silicon atoms, or protective films, and then the film layers need to be removed, which all belong to the scope of the device component of the present disclosure. Specifically, the device component may be, for example, a semiconductor device or a semiconductor component.

[Manufacturing Method of Semiconductor]

The present disclosure also provides a manufacturing method of a semiconductor, which includes following steps:
  providing a substrate;
  coating a siloxane resin layer on the substrate;
  coating a photoresist layer on the siloxane resin layer to form a multilayered substrate;
  performing photolithography and etching processes on the multilayered substrate; and
  using the alkaline cleaning composition of the present disclosure to clean and remove residues of the siloxane resin layer and the photoresist layer attached onto the substrate.

Specifically, the substrate is a semiconductor substrate, such as a silicon substrate. The siloxane resin layer as an anti-reflective coating layer, the photoresist layer is coated on the siloxane resin layer to pattern the siloxane resin layer by the photolithography process, and a pattern is transferred to the substrate by the etching process to complete patterning of the substrate. Next, the alkaline cleaning composition of the present disclosure is used to clean and remove the residues of the siloxane resin layer and the photoresist layer attached onto the substrate.

EXAMPLES

Specific examples 1 to 15 of the present disclosure and comparative examples 1 to 14 are shown in table 1, and evaluation results of removal abilities and contents of the volatile organic compounds thereof are shown in table 2.
  PGME: propylene glycol monomethyl ether
  DPGME: dipropylene glycol monomethyl ether
  PG: propylene glycol
  EDG: diethylene glycol monoethyl ether
  NIP: N-isopropyl-2-pyrrolidone
  TOU: 2,5,7,10-tetraoxaundecane
  TMAH: tetramethylammonium hydroxide
  MEA: ethanolamine
  N-PA: propanolamine
  surfactant: octylphenol polyethylene glycol ether (an average number of ethylene oxide is 9).

TABLE 1

|  | first solvent |  | second solvent |  | alkaline compound |  | surfactant | water |
|---|---|---|---|---|---|---|---|---|
| example 1 | 40.0% |  | EDG | 49.5% | TMAH | 0.5% | — | 10.0% |
| example 2 | 40.0% |  | EDG | 46.7% | TMAH | 3.3% | — | 10.0% |

TABLE 1-continued

| | first solvent | | second solvent | alkaline compound | | surfactant | water |
|---|---|---|---|---|---|---|---|
| example 3 | 30.0% | NIP | 49.0% | TMAH | 1.0% | — | 20.0% |
| example 4 | 10.0% | NIP | 69.0% | TMAH | 1.0% | — | 20.0% |
| example 5 | 28.0% | TOU | 47.6% | TMAH | 1.8% | — | 22.6% |
| example 6 | 30.0% | PG<br>TOU | 5.0%<br>35.0% | TMAH | 2.0% | — | 28.0% |
| example 7 | 20.0% | PG<br>TOU | 15.0%<br>35.0% | TMAH | 2.0% | — | 28.0% |
| example 8 | 40.0% | EDG | 29.5% | TMAH | 0.5% | — | 30.0% |
| example 9 | 40.0% | EDG | 20.0% | TMAH | 10.0% | — | 30.0% |
| example 10 | 30.0% | EDG | 39.5% | TMAH | 0.5% | — | 30.0% |
| example 11 | 20.0% | EDG | 49.5% | TMAH | 0.5% | — | 30.0% |
| example 12 | 10.0% | EDG | 59.5% | TMAH | 0.5% | — | 30.0% |
| example 13 | 5.0% | EDG | 64.5% | TMAH | 0.5% | — | 30.0% |
| example 14 | 25.0% | TOU | 35.0% | TMAH<br>N-PA | 2.0%<br>10.0% | — | 28.0% |
| example 15 | 27.3% | EDG | 49.1% | TMAH<br>MEA | 0.9%<br>4.5% | — | 18.2% |
| comparative example 1 | 40.0% | EDG | 54.5% | TMAH | 0.5% | — | 5.0% |
| comparative example 2 | 40.0% | EDG | 52.5% | TMAH | 0.5% | — | 7.0% |
| comparative example 3 | — | DPGME | 78.0% | TMAH | 2.0% | — | 20.0% |
| comparative example 4 | — | EDG | 69.5% | TMAH | 0.5% | — | 30.0% |
| comparative example 5 | 10.0% | EDG | 49.5% | TMAH | 0.5% | — | 40.0% |
| comparative example 6 | 10.0% | PG<br>TOU | 25.0%<br>23.0% | TMAH | 2.0% | — | 40.0% |
| comparative example 7 | 68.6% | TOU | 7.6% | TMAH | 1.8% | — | 22.0% |
| comparative example 8 | 60.0% | TOU | 9.5% | TMAH | 3.0% | — | 27.5% |
| comparative example 9 | 60.0% | EDG | 9.5% | TMAH | 0.5% | — | 30.0% |
| comparative example 10 | 45.0% | EDG | 24.5% | TMAH | 0.5% | — | 30.0% |
| comparative example 11 | 97.5% | — | | TMAH | 0.5% | — | 2.0% |
| comparative example 12 | 40.0% | EDG | 57.5% | TMAH | 0.5% | — | 2.0% |
| comparative example 13 | 50.0% | — | | MEA | 15.0% | 12.0% | 23.0% |
| comparative example 14 | 10.0% | — | | TMAH<br>MEA | 8.0%<br>8.0% | 10.0% | 64.0% |

TABLE 2

| | removal ability | VOCs |
|---|---|---|
| example 1 | ○ | ○ |
| example 2 | ○ | ○ |
| example 3 | ○ | ○ |
| example 4 | ○ | ○ |
| example 5 | ○ | ○ |
| example 6 | ○ | ○ |
| example 7 | ○ | ○ |
| example 8 | ○ | ○ |
| example 9 | ○ | ○ |
| example 10 | ○ | ○ |
| example 11 | ○ | ○ |
| example 12 | ○ | ○ |
| example 13 | ○ | ○ |
| example 14 | ○ | ○ |
| example 15 | ○ | ○ |
| comparative example 1 | X | ○ |
| comparative example 2 | X | ○ |
| comparative example 3 | X | ○ |
| comparative example 4 | X | ○ |
| comparative example 5 | X | ○ |
| comparative example 6 | X | ○ |
| comparative example 7 | ○ | X |
| comparative example 8 | ○ | X |
| comparative example 9 | ○ | X |
| comparative example 10 | ○ | X |
| comparative example 11 | X | X |
| comparative example 12 | X | X |
| comparative example 13 | X | X |
| comparative example 14 | X | ○ |

Evaluation of removal ability: a polysiloxane anti-reflective layer is taken as an example in the present disclosure.

○ means that the polysiloxane anti-reflective layer can be removed within 90 seconds, and X means that the polysiloxane anti-reflective layer cannot be removed within 90 seconds.

The polysiloxane anti-reflective layer mentioned above is a cured film layer having a thickness of 120 nm, which is formed by coating a polysiloxane resin onto a silicon wafer and then baking for 3 minutes. Then cured film layers are individually soaked in cleaning compositions of the examples and the comparative examples as cleaning agents for 90 seconds, and temperatures of the cleaning agents are 60° C. After soaking, the cured film layers are rinsed with pure water at 22° C. for 30 seconds. After drying by air blade, confirming a removal state of the cured film layers on surfaces of silicon wafers. The removal state of the cured film layers on the surfaces of the silicon wafers can be judged directly with naked eyes.

Evaluation of the contents of the volatile organic compounds (VOCs): Using a handheld photoionized VOC detector for measurement. Keeping 100 mL of the cleaning agents in 500 mL bottles under 1 atm, tighten caps of the bottles, and place the bottles at 23° C. for 20 minutes. While opening the caps, put a sampling nozzle at mouths of the 500 mL bottles, and read maximum detection values of the VOC detector within 30 seconds. ○ means that the contents of the volatile organic compounds are less than 50 ppm, and X means that the contents of the volatile organic compounds are greater than 50 ppm.

From the examples and the comparative examples mentioned above, it can be known that by using 5% to 40% by weight of propylene glycol monomethyl ether as the first solvent and 10% to 30% by weight of water, and combining the polar solvent of other acetals, glycol ethers, pyrrolidones, or a combination thereof as the second solvent in the existence of the alkaline compound, the alkaline cleaning composition of the present disclosure can be equipped with the lower content of the volatile organic compounds and an excellent removal ability of residual films, thereby preventing yields of subsequent processes from being affected.

On the contrary, since the comparative examples do not use 5% to 40% by weight of propylene glycol monomethyl ether as the first solvent and 10% to 30% by weight of water, a removal ability of residual films thereof is poor, an amount of the volatile organic compounds thereof is higher, or even both evaluation results are poor.

Although the present disclosure has been disclosed in a number of preferred embodiments, it is not intended to limit the present disclosure, but only to enable those with ordinary knowledge to clearly understand the implementation content of the present disclosure. For a person of ordinary skill in the art, various changes and modifications can be made without departing from the spirit and scope of the present disclosure that is intended to be limited only by the appended claims.

What is claimed is:

1. An alkaline cleaning composition, comprising a quaternary ammonium hydroxide, 5% to 40% by weight of propylene glycol monomethyl ether, 10% to 30% by weight of water, and a polar solvent;
    wherein the polar solvent comprises a solvent having a structure shown in a following formula (3), (4), or (5), or a combination thereof:

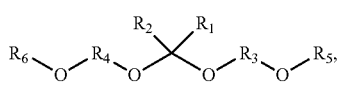

formula (3)

wherein $R_1$ and $R_2$ are independently hydrogen or a $C_1$-$C_6$ alkyl group that is unsubstituted or at least one —$CH_2$— is substituted with —O—; $R_3$ and $R_4$ are independently a $C_1$-$C_4$ alkylene group; and $R_5$ and $R_6$ are independently a $C_1$-$C_3$ alkyl group;

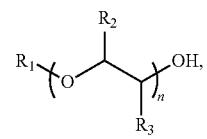

formula (4)

wherein $R_1$ is hydrogen or a $C_1$-$C_4$ alkyl group that is unsubstituted or substituted with a hydroxyl group; $R_2$ and $R_3$ are independently hydrogen or a $C_1$-$C_2$ alkyl group; and n is an integer ranging from 1 to 4; and

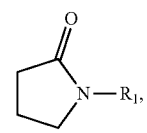

formula (5)

wherein $R_1$ is a $C_1$-$C_3$ alkyl group; and the alkaline cleaning composition is free of benzenesulfonic acid.

2. The alkaline cleaning composition according to claim 1, wherein the quaternary ammonium hydroxide has a structure shown in a following formula (1):

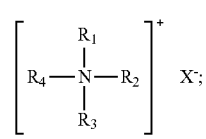

formula (1)

wherein $R_1$ to $R_4$ are each independently a $C_1$-$C_4$ alkyl group that is unsubstituted or substituted with a hydroxyl group.

3. The alkaline cleaning composition according to claim 1, wherein the quaternary ammonium hydroxide is at least one selected from the group consisting of tetramethylammonium hydroxide, tetraethylammonium hydroxide, tetrapropylammonium hydroxide, tetrabutylammonium hydroxide, ethyltrimethylammonium hydroxide, diethyldimethylammonium hydroxide, (2-hydroxyethyl)trimethylammonium hydroxide, bis(2-hydroxyethyl)dimethylammonium hydroxide, and tris(2-hydroxyethyl)methylammonium hydroxide.

4. The alkaline cleaning composition according to claim 1, wherein an amount of the quaternary ammonium hydroxide in the alkaline cleaning composition ranges from 0.1% to 20% by weight.

5. The alkaline cleaning composition according to claim 1, wherein the polar solvent is at least one selected from the group consisting of 4,8-dimethyl-2,5,7,10-tetraoxaundecane, 2,5,7,10-tetraoxaundecane, 6-(2-methoxyethoxy)-2,5,7,10-tetraoxaundecane, propylene glycol, propylene glycol monoethyl ether, ethylene glycol monomethyl ether, ethylene glycol monobutyl ether, diethylene glycol monomethyl ether, diethylene glycol monoethyl ether, diethylene glycol monobutyl ether, dipropylene glycol monomethyl ether, N-methyl-2-pyrrolidone, N-ethyl-2-pyrrolidone, and N-isopropyl-2-pyrrolidone.

6. The alkaline cleaning composition according to claim 1, wherein an amount of the polar solvent in the alkaline cleaning composition ranges from 5% to 84.9% by weight.

7. An alkaline cleaning composition, comprising a quaternary ammonium hydroxide, 5% to 40% by weight of propylene glycol monomethyl ether, 10% to 30% by weight of water, and a polar solvent;
   wherein the polar solvent is at least one selected from the group consisting of N-isopropyl-2-pyrrolidone, N-ethyl-2-pyrrolidone, 2,5,7,10-tetraoxaundecane, diethylene glycol monoethyl ether, diethylene glycol monobutyl ether, and propylene glycol, and the alkaline cleaning composition is free of benzenesulfonic acid.

8. A cleaning method, comprising a step of using the alkaline cleaning composition according to claim 1 to clean and remove a residue or a residual film attached onto a device component, wherein the residue or the residual film comprises a resist or an inorganic substance comprising silicon atoms.

9. A manufacturing method of a semiconductor, comprising following steps:
   providing a substrate;
   coating a siloxane resin layer on the substrate;
   coating a photoresist layer on the siloxane resin layer to form a multilayered substrate;
   performing photolithography and etching processes on the multilayered substrate; and
   using the alkaline cleaning composition according to claim 1 to clean and remove residues of the siloxane resin layer and the photoresist layer attached onto the substrate.

* * * * *